(12) United States Patent
Nemouchi et al.

(10) Patent No.: US 9,548,210 B2
(45) Date of Patent: Jan. 17, 2017

(54) FABRICATION METHOD OF A TRANSISTOR WITH IMPROVED FIELD EFFECT

(71) Applicants: COMMISSARIAT A L'ENERGIE ATOMIQUE ET AUX ENERGIES ALTERNATIVES, Paris (FR); STMICROELECTRONICS (Crolles 2) SAS, Crolles (FR)

(72) Inventors: Fabrice Nemouchi, Moirans (FR); Emilie Bourjot, Grenoble (FR)

(73) Assignees: COMMISSARIAT A L'ENERGIE ATOMIQUE ET AUX ENERGIES ALTERNATIVES, Paris (FR); STIMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/695,787

(22) Filed: Apr. 24, 2015

(65) Prior Publication Data
US 2015/0311287 A1 Oct. 29, 2015

(30) Foreign Application Priority Data

Apr. 24, 2014 (FR) ...................................... 14 00969

(51) Int. Cl.
*H01L 21/768* (2006.01)
*H01L 21/3105* (2006.01)
(Continued)

(52) U.S. Cl.
CPC ... *H01L 21/31051* (2013.01); *H01L 21/28518* (2013.01); *H01L 21/76843* (2013.01);
(Continued)

(58) Field of Classification Search
CPC .................. H01L 29/1054; H01L 21/823807;
H01L 21/28518; H01L 21/823814; H01L
29/7845; H01L 21/76883; H01L
21/31051; H01L 29/66477; H01L
21/76879; H01L 21/7684; H01L
21/76852; H01L 29/66636; H01L
29/7848; H01L 29/7843; H01L 29/66545;
H01L 29/66628
(Continued)

(56) References Cited

U.S. PATENT DOCUMENTS 5,998,873 A 12/1999 Blair et al.
2001/0016417 A1 8/2001 Thakur et al.
(Continued)

*Primary Examiner* — Caleen Sullivan
(74) *Attorney, Agent, or Firm* — Oliff PLC

(57) ABSTRACT

Fabrication of a field-effect transistor is performed on a substrate comprising a film made from first semiconductor material, a gate dielectric covered by a gate electrode, source and drain areas separated by the gate electrode, a protection layer covering gate electrode and source and drain areas, and an access hole to the source area and/or to drain area. Metallic material is deposited in the access hole in contact with the first semiconductor material of the source and/or drain area. An electrically conducting barrier layer that is non-reactive with the first semiconductor material and with the metallic material is deposited before reaction of metallic material with first semiconductor material. Transformation heat treatment of the metallic material with the semiconductor material is performed to form a metallic material having a base formed by the semiconductor material generating a set of stresses on a conduction channel arranged between the source and drain areas.

16 Claims, 5 Drawing Sheets

(51) Int. Cl.
*H01L 21/8238* (2006.01)
*H01L 21/285* (2006.01)
*H01L 29/10* (2006.01)
*H01L 29/66* (2006.01)
*H01L 29/78* (2006.01)

(52) U.S. Cl.
CPC .. *H01L 21/76855* (2013.01); *H01L 21/76883* (2013.01); *H01L 21/823807* (2013.01); *H01L 21/823814* (2013.01); *H01L 29/7845* (2013.01); *H01L 29/665* (2013.01); *H01L 29/66545* (2013.01); *H01L 29/66628* (2013.01); *H01L 29/66636* (2013.01); *H01L 29/7843* (2013.01); *H01L 29/7848* (2013.01)

(58) Field of Classification Search
USPC .......................................................... 438/653
See application file for complete search history.

(56) References Cited

U.S. PATENT DOCUMENTS

| | | |
|---|---|---|
| 2006/0131662 A1 | 6/2006 | Yamada et al. |
| 2007/0269970 A1 | 11/2007 | Purtell et al. |
| 2008/0157208 A1 | 7/2008 | Fischer et al. |
| 2009/0152599 A1 | 6/2009 | Gao et al. |
| 2012/0074502 A1 | 3/2012 | Ellis-Monaghan et al. |
| 2013/0193577 A1 | 8/2013 | Tseng et al. |
| 2013/0252412 A1 | 9/2013 | Poiroux et al. |
| 2013/0295734 A1 | 11/2013 | Niebojewski et al. |
| 2014/0154856 A1* | 6/2014 | Alptekin ........... H01L 21/76883 438/299 |

* cited by examiner

FABRICATION METHOD OF A TRANSISTOR WITH IMPROVED FIELD EFFECT

BACKGROUND OF THE INVENTION

The invention relates to a fabrication method of a field-effect transistor.

STATE OF THE ART

The continuous increase of the performances of integrated circuits, for example in terms of consumption and/or operating frequency, is ineluctably resulting in a constant reduction of the size of its components. In order to produce devices with ever-increasing performances, new architectures and/or new materials have been integrated in transistors.

One way of increasing the electric performances of transistors consists in increasing the mobility of the charge carriers. In this way, it is possible to make more current flow through a transistor, all the other parameters being kept the same. In order to modify the mobility of the charge carriers, it is possible to modify the crystalline parameter of the material forming the channel. Modification of the crystalline parameter can be obtained by application of a stress on the conduction channel.

The use of source and drain areas made from silicon-germanium alloy in a silicon substrate has been reported in a large number of documents. The silicon-germanium alloy having a larger lattice parameter, introducing the latter into the source/drain areas gives rise to a compressive stress being applied in the conduction channel. This technique is particularly advantageous for transistors of pMOS type.

In the same way, for nMos type transistors, it is also known to replace the n-doped silicon by deposition of silicon containing carbon atoms. The alloy formed presents a smaller lattice parameter than that of silicon. Under these conditions, a tensile stress is applied on the conduction channel.

Other possibilities also exist to apply stress to the conduction channel. In one embodiment, when fabrication of the device is performed, the deposition conditions of the silicon oxide and/or silicon nitride films are chosen such as to deposit tensile-stressed or compressive-stressed films. As the stressed film is in mechanical contact with the channel of the transistor and more particularly on the conduction channel, a part of the stress is also applied on the channel. Nevertheless, this layer is partially etched as the transistor is progressively formed.

OBJECT OF THE INVENTION

The object of the invention is to provide a fabrication method of a field-effect transistor which presents improved electric performances and is easy to implement.

This result tends to be achieved by means of a method comprising:
providing a substrate comprising:
a film made from first semiconductor material,
a gate dielectric covered by a gate electrode,
source and drain areas separated by the gate electrode,
a protection layer covering the gate electrode and the source and drain areas,
an access hole to the source area and/or to the drain area,
depositing a metallic material, in the access hole, in contact with the first semiconductor material of the source and/or drain area,
and which comprises before reaction of the metallic material with the first semiconductor material:
depositing an electrically conducting barrier layer, the barrier layer being non-reactive with the first semiconductor material and non-reactive with the metallic material,
performing a heat treatment so that the metallic material react with the semiconductor material to form an alloy of the metallic material and of the semiconductor material generating a set of stresses on a conduction channel arranged between the source and drain areas.

In a privileged embodiment, the access hole is successively filled by the barrier layer and by a second metal.

In another privileged embodiment, the metallic material is deposited by means of selective or directional deposition in a direction perpendicular to the surface of the substrate.

In an alternative embodiment, deposition of the barrier layer is an isotropic deposition.

It is particularly advantageous to provide for the method to comprise a chemical mechanical polishing step configured to eliminate the metallic material deposited on the protection layer.

In a privileged embodiment, the first semiconductor material is mainly silicon-based and the metallic material can be chosen from titanium, palladium, platinum, cobalt, nickel, tantalum, molybdenum and tungsten and their alloys so that the set of stresses is a set of tensile stresses of the conduction channel.

In another privileged embodiment, the source and/or drain area is a solid silicon/carbon solution and the metallic material is chosen from titanium, palladium, platinum, cobalt, nickel, tantalum, molybdenum and tungsten and their alloys.

In another remarkable embodiment, the method comprises a planarizing step of the protection layer configured so as to release the electrode gate. It advantageously comprises formation of the access holes to the source and drain areas by means of a mask which comprises a cavity extending on each side of the gate electrode.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

Figure 1:
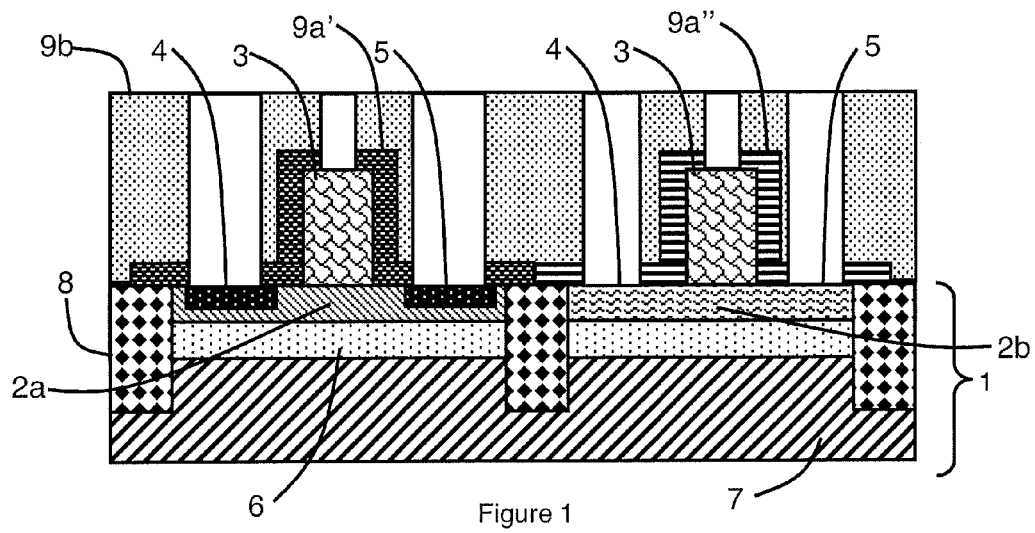
FIGS. 1 to 5 represent a flow of technological steps of a fabrication method with co-integration of two transistors, in schematic manner in cross-section section.

FIG. 1 shows a substrate 1 comprising a film 2 made from first semiconductor material (designated here by reference numerals 2a and 2b) on which a gate dielectric (not shown) and a gate electrode 3 have already been formed. Gate electrode 3 is separated from first semiconductor material film 2 by the gate dielectric. The source area 4 and drain area 5 can be formed in first semiconductor material film 2 and are separated by gate electrode 3. Source and drain areas 4 and 5 are connected by a conduction channel formed in film 2. The conduction channel is arranged under gate electrode 3. Film 2 is monocrystalline. Film 2 is for example made from silicon, but it is also possible to use other semiconductor materials of valence IV or other suitable materials. The embodiment illustrated in FIG. 1 represents co-integration of two transistors T1 and T2 for which the first semiconducting materials are different and are noted 2a and 2b. As a variant, the two materials are identical.

Substrate 1 can be a bulk substrate made from semiconductor material or a more complex substrate, for example a substrate of semiconductor on insulator type. In the case of a semiconductor on insulator substrate, substrate 1 successively comprises a film 2 made from first semiconductor material, an electrically insulating layer 6 and a support 7 which can be a second semiconductor film. Electrically insulating layer 6 can be formed by any suitable material, for example an oxide, a nitride, or a mixture of the latter. For example, electrically insulating layer 6 can be made from silicon oxide or silicon nitride. It is particularly advantageous to use a substrate of semiconductor on insulator type and more particularly a substrate the thickness of the semiconductor film of which is smaller than or equal to 10 nm in order to have a high mechanical stress.

The field-effect transistor can be a single transistor or several transistors can be formed on substrate 1. In advantageous manner, if several transistors are formed, it is preferable to use an insulation pattern 8, for example a pattern made from electrically insulating material which sinks into the substrate also called isolation trench, in particular a trench referred to as STI standing for Shallow Trench Isolation.

Source and/or drain areas 4 and 5 are formed from an electrically conducting material, preferably a doped semiconductor material. Different materials are used. Source and drain areas 4 and 5 can be formed from the same material as that forming the conduction channel as is illustrated for transistor T2. As a variant, it is also possible to form the source and drain areas from a material which has a different lattice parameter from the material forming the conduction channel in order to apply stress in the conduction channel as is illustrated for transistor T1. An opposite configuration can also be applied. In a particular embodiment, source and/or drain areas 4 and 5 are produced with a solid silicon/carbon solution. This material presents a lower lattice parameter than that of silicon which enables a set of tensile stresses to be applied on the conduction channel.

If several transistors are integrated on the substrate, it is possible to have different materials from one transistor to the other, for example different materials for the nMOS transistors and the pMOS transistors.

In a particular embodiment, the thickness of source and drain areas 4 and 5 is comprised between 5 nm and 50 nm. In advantageous manner, the thickness of the source and drain areas is equal to or about 20 nm.

The source and drain areas can be areas the apex of which is in the extension of the interface between first semiconductor material film 2 and the gate dielectric. As a variant, it is possible to form source and drain areas 4 and 5 which are raised, i.e. an addition of material has been made for example to facilitate the subsequent silicidation step and advantageously to optimize the stresses in the conduction channel. In another embodiment, it is also possible to form source and drain areas etched in the semiconductor material film, at a shallower level than the conduction channel.

The substrate is also covered by a protection layer 9 (designated here by 9a', 9a" and 9b) made in an electrically insulating material. Protection layer 9 covers gate electrode 3 and source and drain areas 4 and 5. Protection layer 9 can be a compressive-stressed or tensile-stressed protection layer or a neutral layer.

Protection layer 9 can be made from different types of silicon oxide, silicon nitride or another electrically insulating material.

In a particularly advantageous embodiment, it is advantageous to produce protection layer 9 with a stack of two different layers 9a and 9b. First protection layer 9a is in contact with source and drain areas 4 and 5 and with gate electrode 3. First protection layer 9a is advantageously a layer which is stressed.

In the case where several different transistors are integrated, it is advantageous to use a protection layer 9 formed by at least two layers 9a and 9b. Protection layer 9a is a stressed layer which is in contact with transistor T1 and which is specific to the transistor used. For example, first protection layer 9a' is in contact with transistor T2 and is configured to apply a tensile stress on the channel of an nMOS transistor. On the other hand, first protection layer 9a" is in contact with the transistor and is configured to apply a compressive stress on the channel of a pMOS transistor. An opposite configuration for transistors T1 and T2 is also possible.

First protection layer 9a is covered by a second protection layer 9b which can be neutral or which is less stressed. In the case of co-integration, second layer 9b is advantageously common to all the transistors.

At least one hole is present in protection layer 9 to access source area 4 and/or drain area 5.

First and second protection layers 9a and 9b can be made from the same material, but it is advantageous to use two different materials in order to facilitate formation of an access hole to source area 4, of an access hole to drain area 5 and of an access hole to gate electrode 3. The use of two different materials enables the change of material when the etching step forming the access hole is performed to be better detected.

For example, first protection layer 9a has a thickness comprised between 2 nm and 50 nm. In a preferential embodiment, protection layer 9a is made from silicon nitride. It is advantageous to adjust the nitrogen content and the deposition conditions to form a compressive-stressed layer or a tensile-stressed layer. Second protection layer 9b can have a thickness comprised between 2 nm and 150 nm. In a particular embodiment, second protection layer 9b is itself formed by two elementary layers (not shown). The first elementary layer of layer 9b is a material able to flow and deposited by chemical vapor deposition, for example a silicon oxide. It is advantageous to use a deposition technique chosen from FCVD standing for Flowable Chemical Vapor Deposition and SACVD standing for Sub-Atmospheric Chemical Vapor Deposition. The second elementary layer of layer 9b is another material deposited by chemical vapor deposition. First protection layer 9a is formed by a material which easily fills the holes, which is particularly advantageous for devices of small dimensions. The thickness of first protection layer 9a is advantageously smaller than 50 nm.

Second protection layer 9b is for example a layer of TEOS (tetraethylorthosilicate) or a silicon oxide which can be deposited by High Density Plasma HDP, its thickness advantageously being less than 100 nm and advantageously more than 10 nm.

Figure 6:
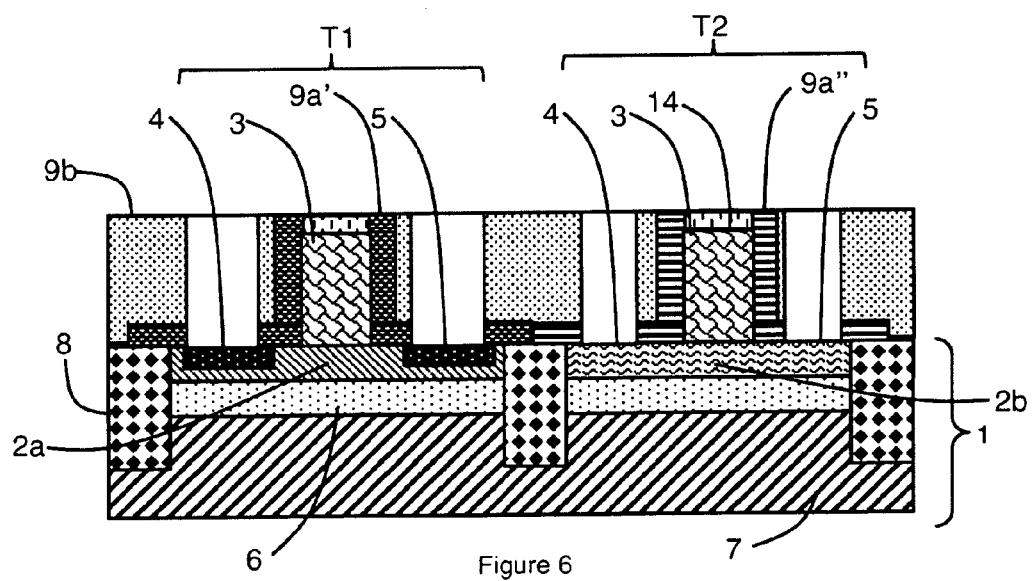
FIG. 6 represents an alternative embodiment of the substrate with co-integration of two transistors, in schematic manner in transverse cross-section section.

As indicated above, protection layer 9 presents an opening: it comprises an access hole to source area 4 and/or to drain area 5. Protection layer 9 can cover the gate as is represented in FIG. 1, but it is also possible to choose the thickness of the protection layer so as to come flush with the top part of the gate (FIG. 6).

In an advantageous embodiment, protection layer 9 comprises an access hole to the source and drain areas and an access hole to the gate electrode. The access holes can be made by any suitable technique, for example by a photolithography step associated with an etching step. A hole can be made for each electrode (FIG. 7) or it is possible to make one hole for the whole set of electrodes (FIG. 8) and to use the lateral spacers of the gate electrode as electric insulator between the electrodes. An example embodiment of the access holes is illustrated in the documents US2013/0295734 and US 2013/0252412.

In particularly advantageous manner, it is advantageous to form all the access holes in a single etching step. The access holes can be of any shape. The smallest lateral dimension of the hole, i.e. in a plane parallel to the surface of substrate 1, is comprised between 5 and 30 nm.

Figure 2:
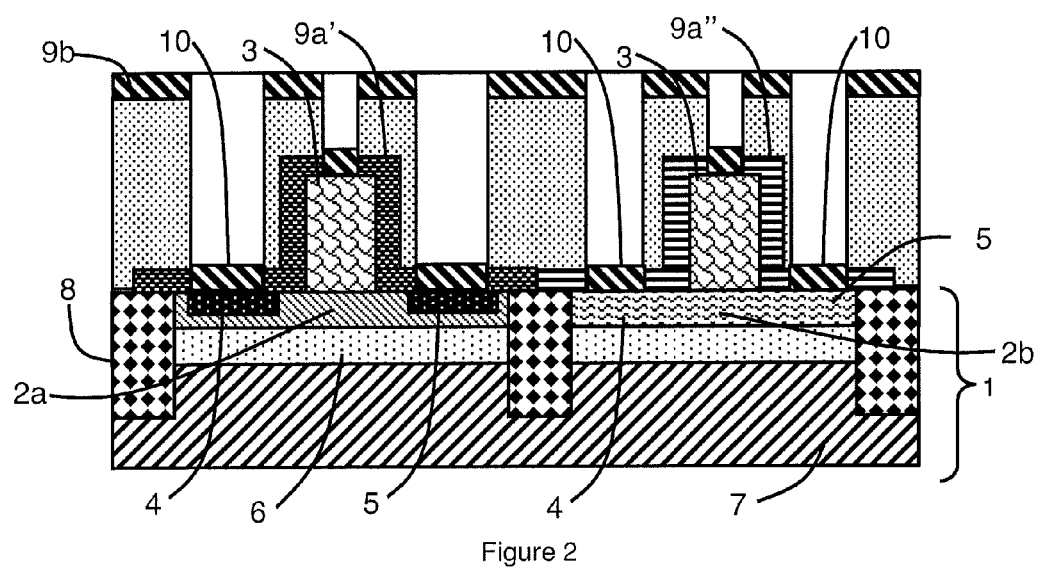

As illustrated in FIG. 2, deposition of a metallic material 10 is performed in the access holes in order to form an interface between metallic material 10 and the semiconductor materials forming source area 4, drain area 5 and possibly gate electrode 3. Metallic material 10 can be deposited by any suitable technique, for example by chemical vapor deposition (CVD), by physical vapor deposition (PVD) or by electrochemical deposition. Metallic material 10 can be a pure element or a metal alloy, for example an alloy containing 90% Nickel and 10% Platinum (in atomic percentage).

In advantageous manner, deposition of metallic material 10 is performed by a directional or selective deposition technique which enables the metallic material 10 to be localised in the bottom of the access holes and on the top of protection layer 9. Deposition is advantageously performed in a direction perpendicular to the surface of the substrate, here perpendicular to the interface between the gate dielectric and the first semiconductor material. The use of directional or selective deposition enables deposition of the metallic material on the sides of the holes to be reduced or even prevented thereby preventing short-circuiting.

The thickness of deposition of metallic material 10 and the annealing conditions are configured so as to define the quantity of semiconductor material and of metallic material which will react. According to the embodiments, it is possible to obtain partial or total reaction of the source and/or drain areas. It is also possible to provide for reaction of gate 3. However, it is advantageous not to transform the channel.

In an advantageous embodiment, the deposited thickness of metallic material 10 is comprised between 0.5 nm and 10 nm and advantageously equal to 4 nm. For example, for a deposition of 4 nm of nickel, annealing at 400° C. can be used to form a NiSi phase. Deposition of titanium or cobalt can also be formed and annealing at 600° C. can be used. In an alternative embodiment, two successive annealing at different temperatures are performed after filling the access hole. The first anneal is configured to form a first metal compound and the second anneal is configured to form a second metal compound different from the first metal compound.

Figure 3:
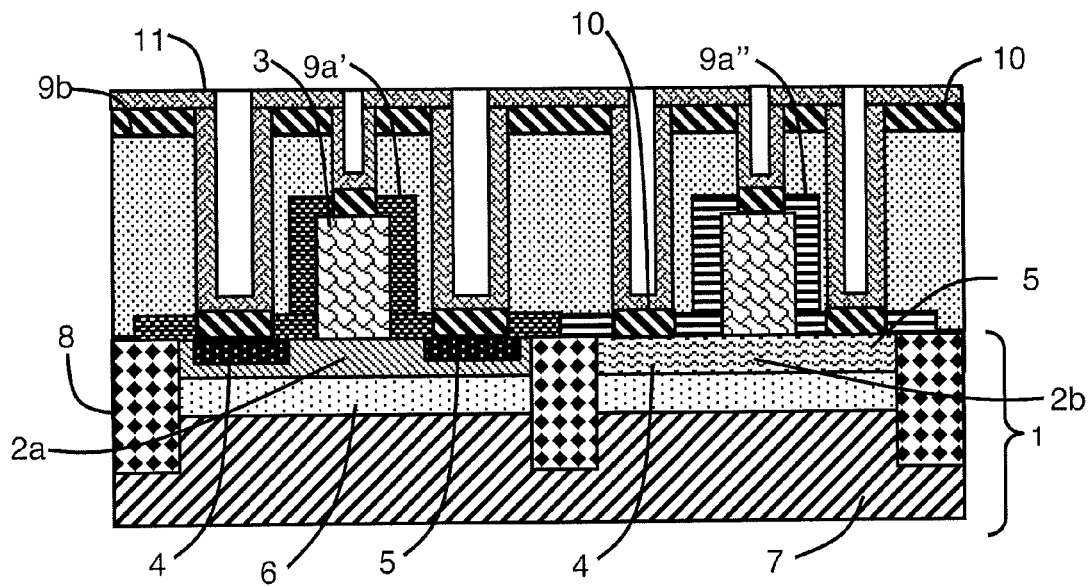

As illustrated in FIG. 3, deposition of metallic material 10 is followed by deposition of a barrier layer 11. Barrier layer 11 is for example made from TiN. Barrier layer 11 is an electrically conducting layer. Barrier layer 11 is made from a material which does not react with the semiconductor materials forming source and drain areas 4 and 5 or with the semiconductor material forming gate electrode 3. Barrier layer 11 is made from a material which does not react with metallic material 10.

The barrier layer is advantageously a layer which blocks Cu, W and O atoms in order to obtain a device providing good electric performances. It is advantageous to form a conformal and continuous barrier layer. In particularly advantageous manner, the barrier layer material is a more rigid material than semiconductor material 2 in order to limit deformation of barrier layer 11 during the fabrication method.

Deposition of barrier layer 11 can be performed by means of a non-directional deposition technique or by means of another technique. In the illustrated example, the deposition performed is an isotropic deposition, i.e. it is performed using a technique which deposit the same thickness whatever the orientation of the surface to be covered. For example, it is possible to use atomic layer deposition (ALD) or metalorganic chemical vapor deposition (MOCVD). However, an anisotropic technique can also be used.

In advantageous manner, it is necessary to avoid filling the hole only with a material such as TiN which will absorb a part of the stresses. It is preferable to use partial filling by tungsten which is more rigid.

Figure 4:
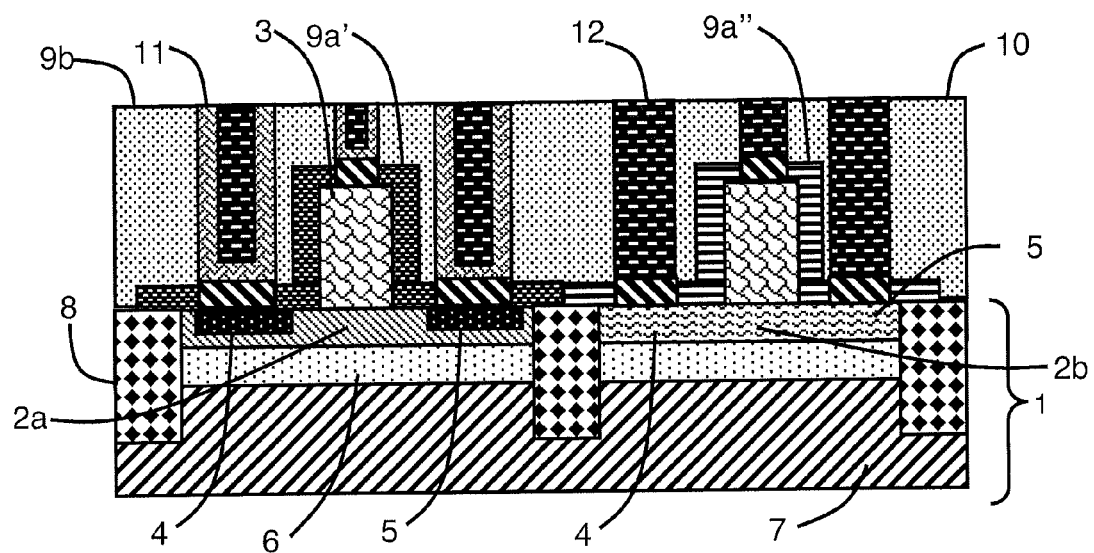

As illustrated in FIG. 4, deposition of barrier layer 11 is advantageously followed by deposition of an electric conductor 12 which will fill the access holes. This electric conductor 12 can be deposited by any suitable technique. This electric conductor 12 is for example tungsten or copper. According to the embodiments, the access hole can be completely filled by barrier layer 11 formed by a stack of several electrically conducting materials. In advantageous manner, the materials covering barrier layer 11 are metallic materials, for example pure metals or alloys. In a particular embodiment, the Young's modulus of electric conductor 12 is higher than the Young's modulus of the semiconductor material to increase the stress transfer. For example, in the case where the semiconductor material is made from silicon (the Young's modulus is equal to 130 GPa), it is advantageous to use tungsten which has a Young's modulus equal to 406 GPa.

In an advantageous embodiment, it is possible to modulate the difference of rigidity between semiconductor material 2 and electric conductor 12 by performing amorphization of the semiconductor material for example by ion implantation. It is also possible to add an element for the purpose of forming a more rigid material before depositing electric conductor 12. For example, if semiconductor material 2 is made from germanium or germanium base, it is advantageous to add silicon to form a SiGe alloy which is more rigid.

The embodiment illustrated in FIG. 4 represents a co-integration of a transistor T1 provided with an increased set of stresses and a transistor T2 devoid of this increased set of stresses as there is no barrier layer 11.

In the case where barrier layer 11 is associated with deposition of electric conductor 12, the thickness of barrier layer 11 is advantageously comprised between 1 and 10 nm. The thickness of electric conductor 12 is advantageously comprised between 1 and 25 nm. In advantageous manner, electric conductor 12 completely fills the hole, i.e. up to the top.

As indicated in the foregoing, deposition of metallic material 10 is followed by deposition of barrier layer 11. This sequence is devoid of a low-temperature annealing step which leads to reaction of metallic material 10 with semiconductor material 2 in contact. This sequence is also devoid of a selective etching step of metallic material 10 which has not reacted with semiconductor material 2. The deposition temperature of barrier layer 11 is therefore lower than the formation temperature of the alloy between metallic material 10 and semiconductor material 2. In advantageous manner, the deposition temperature of electric conductor 12 is lower than the formation temperature of the metallic material coming from a semiconductor material 13, e.g. silicide. The formation temperature of the alloy between the metallic material and the semiconductor material depends on the materials used.

In this particular configuration illustrated in FIG. 3, the following successive stack is to be found at the level of source area 4 and/or drain area 5 and possibly at the level of gate electrode 3: semiconductor material 2, non-reacted metallic material 10 and barrier layer 11.

Figure 5:
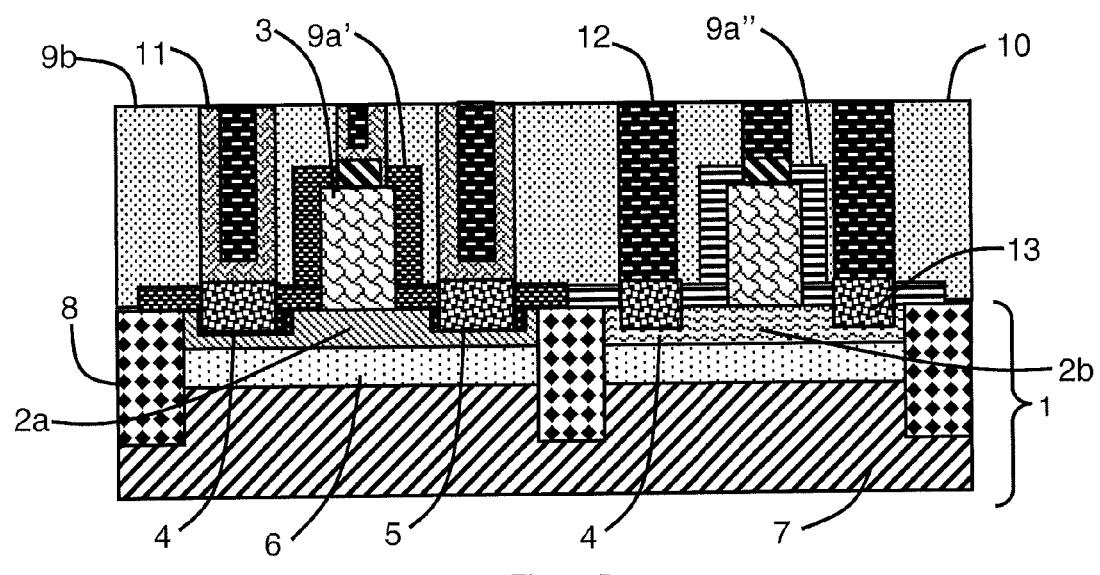

As illustrated in FIG. 5, heat treatment is performed and configured to make metallic material 10 react with the semiconductor material or materials after deposition of barrier layer 11 and preferably after filling of the access holes. In this configuration, the reaction for forming an alloy 13 between metallic material 10 and semiconductor material 2 (for example a silicide or a germanide) is performed in a confined environment. Alloy 13 is electrically conducting.

Formation of alloy 13 having a metallic behaviour based on semiconductor material and on a metal results in a reduction of volume. In other words, the volume occupied by alloy 13 is smaller than the volume initially occupied by metallic material 10 and semiconductor material 2 before reaction.

As the reaction takes place in solid state and in a confined environment, the reduction of volume leads to the appearance of a set of stresses on the conduction channel. The stress can be applied from source area 4 and/or from drain area 5. It is particularly advantageous to perform formation of alloy 13 in source and drain areas 4 and 5 to have a maximum stress on the conduction channel.

Silicidation of the semiconductor material forming gate electrode 3 has a relatively small effect on the mobility of the carriers. It is therefore possible to perform silicidation of the gate in a different manner from that which is used for source and drain electrodes 4 and 5. It is also possible, later on in the method, to provide for replacement of the material delineating gate electrode 3 by a more suitable material.

If source and drain areas 4 and 5 are formed by silicon or by a material mainly containing silicon, it is advantageous to use a metallic material 10 chosen from titanium, palladium, platinum, cobalt, nickel, tantalum, molybdenum and tungsten and their alloys. In particularly advantageous manner, nickel and nickel alloys will be used as the difference of volume is large when formation of a silicide takes place. This fabrication method is particularly advantageous for formation of transistors of nMOS type as the stress applied is a tensile stress on the conduction channel. This effect can be associated with the use of source and drain areas 4 and 5 in a solid silicon/carbon solution.

In the case where the access holes are completely filled, there is a risk of short-circuiting between the different electrodes of the transistor. It is then particularly advantageous to localise the electrically conducting materials in the access holes.

In advantageous manner, a step of localization of the different, notably metallic, materials in the access holes is performed before the heat treatment for formation of alloy 13. Localisation is for example achieved by means of a chemical mechanical polishing step.

In a particularly advantageous embodiment, several transistors are formed and only a part of these transistors presents a tensile stress applied from the formation of alloy 13.

One way of performing co-integration is to protect certain transistors when deposition of the metals and metallic materials is performed in order to prevent generation of stresses from alloy 13. A sacrificial material is deposited to cover and protect second transistor T2. First transistor T1 is left uncovered. A first metal and at least one barrier layer are deposited. Heat treatment is performed so as to make the metallic material react with the semiconductor material. Then the sacrificial material is eliminated. The first transistor may be protected if required. A second metal is deposited and reacts with the semiconductor material to form a second field-effect transistor. The second metal can be identical or not to the first metal.

As a variant, it is also possible to deposit barrier layer 11 on several transistors and to eliminate this barrier layer where it is not desired, for example on transistor T2 of FIG. 4.

For second transistor T2, it is possible to perform a more conventional transformation method by applying a first annealing configured to make the metallic material react with semiconductor material 2 forming source/drain areas 4 and 5. The excess metallic material is then eliminated and a second annealing is performed so as to form the defined compound which presents the required electric characteristics. For example, if the metallic material is cobalt, the first annealing will form an alloy substantially having the composition CoSi and the second annealing will form the alloy $CoSi_2$.

The annealing performed for formation of alloy 13 for transistor T1 can be common with the annealing designed to form another alloy between a semiconductor material and a metallic material on transistor T2.

In another configuration, the same metallic material is deposited for the two transistors. For first transistor T1, the metallic material is covered by barrier layer 11 for application of the stress. For second transistor T2, the barrier layer is absent. Under these conditions, when annealing is performed, the tensile stress is not applied as the volume of the alloy can change freely without generating a large quantity of stresses on the conduction channel.

In this configuration, it is particularly advantageous to provide an oxygen blocking layer, for example a thin layer of silicon nitride which will not be able to apply the stress on the source/drain areas of the transistor.

In the case of co-integration, it may be easy to visually differentiate transistor T1 and transistor T2. In the case where the metallic material is deposited by a physical vapor deposition technique, a part of the metallic material is present on the edges of the holes formed in protection layer 9. This deposition is encapsulated by barrier layer 11 and it remains present throughout the method. In the case of a conventional silicidation, the metallic material present on the sides of the holes does not react and is eliminated when removal of the metallic material which has not reacted is performed.

This configuration is particularly advantageous as it is compatible with the use of stressed source and drain areas and it is also compatible with the use of stressed protection layers.

In the case where the source/drain areas are made from silicon-germanium alloy, a compressive stress may be present. The use of the method presented above enables this compressive stressed to be reduced. It is then advantageous to form two transistors one of which uses the barrier layer and the other of which is devoid of the barrier layer. In this case, it is possible to modulate the compressive stress in the transistor. For example, if the barrier layer presents a lower Young's modulus than that of the material forming conductor 12, elimination of the barrier layer can result in an increase of the tensile strength. It will then be preferable to orient this embodiment preferentially to fabrication of nMOS transistors.

As indicated in the foregoing, in a preferential embodiment, a planarizing step is performed after deposition of protection layer 9 and more particularly after deposition of layer 9b. The planarizing step is configured so that the surface of the stack is flat and that it comprises areas made from protection layer 9 and areas made from a gate pattern. In this manner, access to gate pattern 3 is ensured.

In advantageous manner illustrated in FIG. 6, the stack forming the gate pattern comprises an etch stop layer 14 for example made from silicon nitride. In this way, the surface comprises areas made from protection layer 9 and areas made from silicon nitride.

Figure 7:
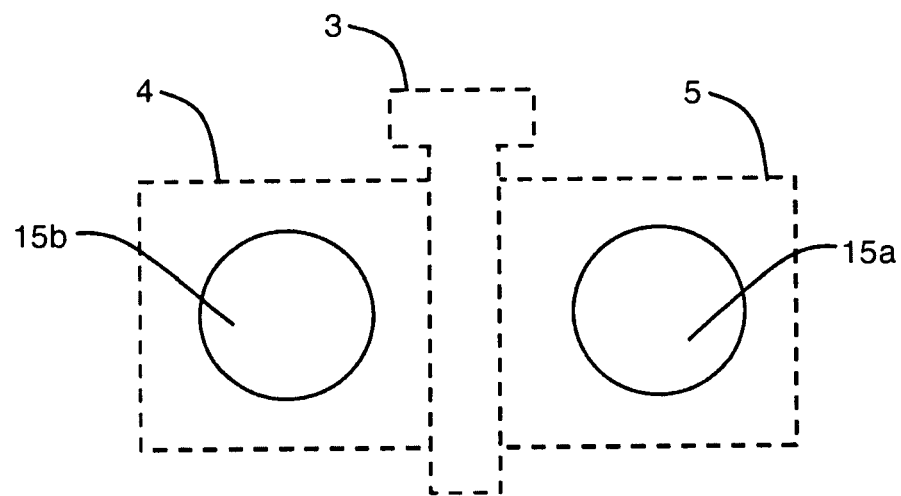
FIGS. 7 and 8 represent two definition masks of the contact holes in the protection layer, in schematic manner in top view.

Access to the source and/or drain areas can be achieved by means of a specific mask defining the contacts as illustrated in FIG. 7. In the illustrated example, the mask comprises two cavities 15a and 15b which are designed to form two circular contact holes in protection layer 9.

Figure 8:
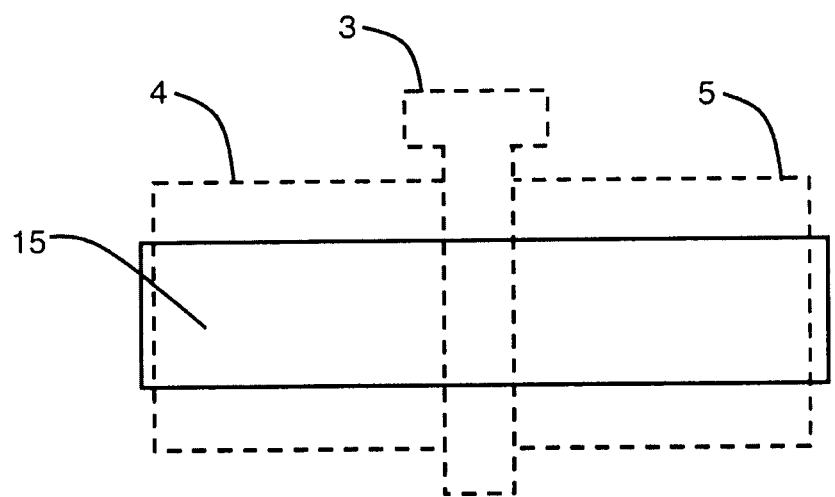

However as illustrated in FIG. 8, it is advantageous to use a mask presenting a cavity 15 having the same shape as the active area or substantially the same shape as the active area to release a large surface of the source and drain areas. The mask is configured to access source area 4 and drain area 5 by means of a single cavity. The cavity extends on each side of gate electrode 3. Preferably, the cavity extends over the whole dimension of the active area, i.e. so as to reach insulation pattern 8. The cavity of the mask advantageously extends along the other dimension to release the whole of the active area in the longitudinal axis of gate electrode 3. The cavity of the mask can overlap onto the insulation pattern taking care not to short-circuit the source and drain areas. In the example illustrated in FIG. 8, the cavity overlaps onto the insulation pattern in the direction perpendicular to the longitudinal axis of the gate electrode. Along the longitudinal axis of the gate electrode, the cavity does not extend up to the insulation pattern.

As in the previous embodiments, a layer of metallic material 10 is deposited on the source and drain areas. Barrier layer 11 and then possibly electric conductor 12 are deposited. The annealing configured to form alloy 13 is performed.

The invention claimed is:

1. A fabrication method of a field-effect transistor, comprising the following consecutive steps:
   providing a substrate comprising:
      a film made from first semiconductor material,
      a gate dielectric covered by a gate electrode,
      source and drain areas separated by the gate electrode,
      a protection layer covering the gate electrode and the source and drain areas, and
      an access hole to the source area and/or to the drain areas,
   depositing a metallic material in the access hole of the source and/or drain areas so that the metallic material is in contact with the first semiconductor material,
   depositing an electrically conducting barrier layer, said barrier layer being non-reactive with the first semiconductor material and non-reactive with the metallic material,
   depositing an electric conductor on said barrier layer so as to fill said access hole, and
   performing a heat treatment so that the metallic material react with the semiconductor material to form an alloy between a metallic material and the semiconductor material generating a set of stresses on a conduction channel arranged between the source and drain areas,
   wherein the metallic material is deposited by means of selective deposition or directional deposition in a direction perpendicular to the surface of the substrate.

2. The fabrication method according to claim 1, wherein the electric conductor presents a higher Young's modulus than a Young's modulus of the first semiconductor material.

3. The fabrication method according to claim 1, wherein depositing the barrier layer is performed by isotropic deposition.

4. The fabrication method according to claims 1, wherein the first semiconductor material is mainly silicon-based and the metallic material is chosen from titanium, palladium, platinum, cobalt, nickel, tantalum, molybdenum and tungsten and their alloys so that the set of stresses is a set of tensile stresses of the conduction channel.

5. The fabrication method according to claim 1, wherein the source and/or drain area is formed by a solid silicon-carbon solution and the metallic material is chosen from titanium, palladium, platinum, cobalt, nickel, tantalum, molybdenum and tungsten and their alloys.

6. The fabrication method according to claim 1, wherein the deposition results in the metallic material being deposited only on the bottom portion of the access hole of the source and drain area.

7. A fabrication method of a field-effect transistor, comprising the following consecutive steps:
   providing a substrate comprising;
      a film made from first semiconductor material,
      a gate dielectric covered by a gate electrode,
      source and drain areas separated by the gate electrode,
      a protection layer covering the gate electrode and the source and drain areas, and
      an access hole to the source area and/or to the drain areas,
   depositing a metallic material in the access hole of the source and/or drain areas so that the metallic material is in contact with the first semiconductor material,
   depositing an electrically conducting barrier layer, said barrier layer being non-reactive with the first semiconductor material and non-reactive with the metallic material,
   depositing an electric conductor on said barrier layer so as to fill said access hole, and
   performing a heat treatment so that the metallic material react with the semiconductor material to form an alloy between a metallic material and the semiconductor material generating a set of stresses on a conduction channel arranged between the source and drain areas,
   the fabrication method further comprising a chemical mechanical polishing step configured to eliminate the electric conductor deposited on the protection layer and to electrically dissociate an electric conductor connected to the source area, an electric conductor connected to the drain area, and an electric conductor connected to the gate electrode.

8. The fabrication method according to claim 7, wherein the electric conductor presents a higher Young's modulus than a Young's modulus of the first semiconductor material.

9. The fabrication method according to claim 7, wherein depositing the barrier layer is performed by isotropic deposition.

10. The fabrication method according to claims 7, wherein the first semiconductor material is mainly silicon-based and the metallic material is chosen from titanium, palladium, platinum, cobalt, nickel, tantalum, molybdenum and tungsten and their alloys so that the set of stresses is a set of tensile stresses of the conduction channel.

11. The fabrication method according to claim 7, wherein the source and/or drain area is formed by a solid silicon/carbon solution and the metallic material is chosen from titanium, palladium, platinum, cobalt, nickel, tantalum, molybdenum and tungsten and their alloys.

12. A fabrication method of a field-effect transistor, comprising the following consecutive steps:
   providing a substrate comprising:
      a film made from first semiconductor material,
      a gate dielectric covered by a gate electrode,
      source and drain areas separated by the gate electrode,
      a protection layer covering the gate electrode and the source and drain areas, and
      an access hole to the source area and/or to the drain areas,
   depositing a metallic material in the access hole of the source and/or drain areas so that the metallic material is in contact with the first semiconductor material,
   depositing an electrically conducting barrier layer, said barrier layer being non-reactive with the fist semiconductor material and non-reactive with the metallic material,
   depositing an electric conductor on said barrier layer so as to fill said access hole, and
   performing a heat treatment so that the metallic material react with the semiconductor material to form an alloy between a metallic material and the semiconductor material generating a set of stresses on a conduction channel arranged between the source and drain areas,
   the fabrication method further comprising a planarizing step of the protection layer configured so as to expose the electrode gate and wherein said access holes to the source and drain areas are formed by means of a mask which comprises a cavity extending on each side of the gate electrode.

13. The fabrication method according to claim 12, wherein the electric conductor presents a higher Young's modulus than a Young's modulus of the first semiconductor material.

14. The fabrication method according to claim 12, wherein depositing the barrier layer is performed by isotropic deposition.

15. The fabrication method according to claims 12, wherein the first semiconductor material is mainly silicon-based and the metallic material is chosen from titanium, palladium, platinum, cobalt, nickel, tantalum, molybdenum and tungsten and their alloys so that the set of stresses is a set of tensile stresses of the conduction channel.

16. The fabrication method according to claim 12, wherein the source and/or drain area is formed by a solid silicon/carbon solution and the metallic material is chosen from titanium, palladium, platinum, cobalt, nickel, tantalum, molybdenum and tungsten and their alloys.

* * * * *

UNITED STATES PATENT AND TRADEMARK OFFICE
CERTIFICATE OF CORRECTION

PATENT NO.        : 9,548,210 B2
APPLICATION NO.   : 14/695787
DATED             : January 17, 2017
INVENTOR(S)       : Fabrice Nemouchi et al.

Page 1 of 1

It is certified that error appears in the above-identified patent and that said Letters Patent is hereby corrected as shown below:

On the Title Page

Item (73), Assignees, change "STIMICROELECTRONICS (CROLLES 2) SAS" to
-- STMICROELECTRONICS (CROLLES 2) SAS --

Signed and Sealed this
Eleventh Day of April, 2017

Michelle K. Lee
*Director of the United States Patent and Trademark Office*